(12) United States Patent
Cao et al.

(10) Patent No.: US 11,859,773 B2
(45) Date of Patent: Jan. 2, 2024

(54) LIGHT BULB APPARATUS (71) Applicant: XIAMEN ECO LIGHTING CO. LTD., Xiamen (CN)

(72) Inventors: Liangliang Cao, Xiamen (CN); Yuxin Huang, Xiamen (CN); Fujie Chen, Xiamen (CN); Yibin Chen, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

(21) Appl. No.: 16/847,389

(22) Filed: Apr. 13, 2020

(65) Prior Publication Data
US 2020/0340628 A1 Oct. 29, 2020

(30) Foreign Application Priority Data
Apr. 26, 2019 (CN) .......................... 201920586654.5

(51) Int. Cl.
| | |
|---|---|
| F21K 9/232 | (2016.01) |
| F21K 9/238 | (2016.01) |
| H05B 45/30 | (2020.01) |
| H05B 47/19 | (2020.01) |
| F21S 9/02 | (2006.01) |
| F21V 29/50 | (2015.01) |
| F21Y 107/00 | (2016.01) |
| F21Y 115/10 | (2016.01) |

(52) U.S. Cl.
CPC .............. *F21K 9/232* (2016.08); *F21K 9/238* (2016.08); *F21S 9/02* (2013.01); *F21V 29/50* (2015.01); *H05B 45/30* (2020.01); *H05B 47/19* (2020.01); *F21Y 2107/00* (2016.08); *F21Y 2115/10* (2016.08); *H05K 2201/10106* (2013.01)

(58) Field of Classification Search
CPC .......... F21K 9/232; F21K 9/235; F21K 9/237; F21K 9/238; H01R 33/22
See application file for complete search history.

(56) References Cited

U.S. PATENT DOCUMENTS

| | | | | |
|---|---|---|---|---|
| 1,883,620 | A * | 10/1932 | Olier, Jr. ................ | F21V 21/104 248/342 |
| 5,455,754 | A * | 10/1995 | Hoffner ................... | F21V 21/35 362/147 |
| 9,157,624 | B2 * | 10/2015 | Nourbakhsh ........... | F21V 23/06 |
| 9,408,282 | B1 * | 8/2016 | Springer ............... | H05B 45/20 |
| 9,784,417 | B1 * | 10/2017 | Springer ................ | H05B 45/37 |

(Continued)

*Primary Examiner* — Alexander K Garlen
(74) *Attorney, Agent, or Firm* — Chun-Ming Shih; LANWAY IPR SERVICES (57) ABSTRACT

A light bulb apparatus includes a bulb shell, a light source module, a driver, a first cap body, a wireless module and a second cap body. The light source module includes a plurality of LED modules. The first cap body is connected to the bulb shell. The first cap body has a surrounding wall. The surrounding wall includes metal material. Heat of the light source module and the driver is transmitted to the surrounding wall. The wireless module is electrically connected to the driver. The second cap body is connected to the first cap body and an Edison cap. The Edison cap has two electrodes for receiving an external power source from an Edison socket. The second cap body is made of plastic material. The wireless module is located at least partially in the second cap body.

20 Claims, 4 Drawing Sheets (56) References Cited

U.S. PATENT DOCUMENTS

| | | | |
|---|---|---|---|
| 2011/0095687 A1* | 4/2011 | Jonsson | F21K 9/232 |
| | | | 315/51 |
| 2014/0049963 A1* | 2/2014 | McGuire | F21V 19/04 |
| | | | 362/249.01 |
| 2014/0049972 A1* | 2/2014 | McGuire | H05B 47/19 |
| | | | 362/427 |
| 2014/0268697 A1* | 9/2014 | Smith | H05B 45/37 |
| | | | 362/183 |
| 2016/0230978 A1* | 8/2016 | Kato | G02B 6/00 |
| 2016/0328928 A1* | 11/2016 | Lutz | G08B 5/36 |
| 2019/0331304 A1* | 10/2019 | Ion | F21S 9/02 |
| 2020/0370711 A1* | 11/2020 | Fu | F21V 29/70 |

\* cited by examiner

LIGHT BULB APPARATUS

FIELD

The present invention is related to a light bulb apparatus, and more particularly related to a light bulb apparatus with a flexible configuration.

BACKGROUND

Electroluminescence, an optical and electrical phenomenon, was discover in 1907. Electroluminescence refers the process when a material emits light when a passage of an electric field or current occurs. LED stands for light-emitting diode. The very first LED was reported being created in 1927 by a Russian inventor. During decades' development, the first practical LED was found in 1961, and was issued patent by the U.S. patent office in 1962. In the second half of 1962, the first commercial LED product emitting low-intensity infrared light was introduced. The first visible-spectrum LED, which limited to red, was then developed in 1962.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

With high light output, LEDs are available across the visible, infrared wavelengths, and ultraviolet lighting fixtures. Recently, there is a high-output white light LED. And this kind of high-output white light LEDs are suitable for room and outdoor area lighting. Having led to new displays and sensors, LEDs are now be used in advertising, traffic signals, medical devices, camera flashes, lighted wallpaper, aviation lighting, horticultural grow lights, and automotive headlamps. Also, they are used in cellphones to show messages.

A Fluorescent lamp refers to a gas-discharge lamps. The invention of fluorescent lamps, which are also called fluorescent tubes, can be traced back to hundreds of years ago. Being invented by Thomas Edison in 1896, fluorescent lamps used calcium tungstate as the substance to fluoresce then. In 1939, they were firstly introduced to the market as commercial products with variety of types.

In a fluorescent lamp tube, there is a mix of mercury vapor, xenon, argon, and neon, or krypton. A fluorescent coating coats on the inner wall of the lamp. The fluorescent coating is made of blends of rare-earth phosphor and metallic salts. Normally, the electrodes of the lamp comprise coiled tungsten. The electrodes are also coated with strontium, calcium oxides and barium. An internal opaque reflector can be found in some fluorescent lamps. Normally, the shape of the light tubes is straight. Sometimes, the light tubes are made circle for special usages. Also, u-shaped tubes are seen to provide light for more compact areas.

Because there is mercury in fluorescent lamps, it is likely that the mercury contaminates the environment after the lamps are broken. Electromagnetic ballasts in fluorescent lamps are capable of producing buzzing mouse. Radio frequency interference is likely to be made by old fluorescent lamps. The operation of fluorescent lamps requires specific temperature, which is best around room temperature. If the lamps are placed in places with too low or high temperature, the efficacy of the lamps decreases.

In addition to light tube, light bulbs are widely used in various places. In Edison age, light bulbs emit light by heating a metal strip. Now, the LED technology helps reshape the concept of light bulbs.

It is a long run from past technology to LED technology. Everything is changing while old user habit is kept at the same time. It is important to find new ways to leverage the advantage of the LED technology in even traditional light device setting.

SUMMARY

In some embodiments, a light bulb apparatus includes a bulb shell, a light source module, a driver, a first cap body, a wireless module and a second cap body.

The light source module includes a plurality of LED modules. For example, the LED modules are disposed on a light source plate. In some other embodiments, the LED modules may be embedded in elongated filaments, rigid or flexible. In some other embodiments, the LED modules may be accompanied with a light guide or a lens for changing the light paths. In some embodiments, the LED modules may include LED chips of multiple colors or multiple color temperatures for mixing needed parameters.

The first cap body is connected to the bulb shell. The first cap body has a surrounding wall. The surrounding wall includes metal material. Heat of the light source module and the driver is transmitted to the surrounding wall.

For example, the first cap body is a tube housing with a surrounding wall. The tube housing is made by molding a plastic insulation layer outside an aluminum body. Such tube housing is helpful on heat dissipation. The light source module may be connected to the tube housing directly or indirectly for transmitting to the tube housing. In addition, the tube housing may enclose partially or completely the driver. Heat of the driver that contains multiple electronic components may be transmitted to the tube housing, too.

The wireless module is electrically connected to the driver. The second cap body is connected to the first cap body and an Edison cap. The Edison cap has two electrodes for receiving an external power source from an Edison socket. For example, the lateral screw wall is used for receiving electricity as a first electrode and the bottom piece is used for receiving electricity as a second electrode.

The second cap body is made of plastic material. The wireless module is located at least partially in the second cap body. Unlike being disposed and surrounded by the first cap body, which has metal material, the wireless module is operated in a better environment that no shielding cover affecting signal receiving and transmitting. In addition, to keep the wireless module a distance from the driver helps make the wireless module more stable.

In addition to place a wireless module, other electronic devices that are more sensitive may be added or replace the wireless module mentioned above in other embodiments.

In some embodiments, the first cap body has a plastic surface wrapping an aluminum piece.

In some embodiments, the second cap body has a connecting column extended upwardly to connect to a light source plate of the light source module and is fixed to the first cap body between the lights source module.

In such design, the connecting column is used as a connector for connecting the light source module and the second cap body while clipping the first cap body between the light source module and the second cap body. Such design makes assembling of such light bulb apparatus more easily and thus decrease overall cost.

In some embodiments, an antenna is placed on the light source plate and electrically connected to the wireless module via the connecting column. Since the light source plate is usually facing to an external space so that light may be escaped to outside, the light source plate is a good place for placing wireless antenna. The wireless module in the second cap body or the driver may connect to the antenna on the light source plate for receiving a better signal quality.

In some wireless design, more than one antenna may be used for enhancing signal quality. Therefore, a first antenna may be disposed with the wireless module and a second antenna may be disposed on the light source plate.

In some embodiments, the light bulb apparatus may also include a battery container for containing a battery at least partially stored in the second cap body.

In some embodiments, the wireless module receives a wakeup command from an external device and controls the battery for supplying power to the light source module.

In some embodiments, the light source module is operated with a lower power than being operated connected to an external power source when the battery supplies power to the light source module.

In some embodiments, the second cap body has an opening for installing the battery to the battery container. For example, the second cap body may have a detachable cover so that the battery may be installed and then put back the detachable cover to the second cap body.

In some embodiments, there is a secondary power socket for detachably connecting to a direct current power source. For example, an USB socket may be disposed on the second cap body or the first cap body for receiving a DC 5V power source for the light bulb apparatus to operate in another mode.

In some embodiments, the second cap body has a bracket for holding an external battery for supplying power to the light source module. As mentioned above, the light bulb may be connected to an external power source. It is common and inexpensive to acquire a USB power module today. Such USB power module may be connected to the light bulb apparatus for providing another working mode conveniently.

In some embodiments, there is a bulb socket with an Edison socket inside for connecting to the Edison cap. For example, the bulb socket is made as a part of the light bulb apparatus kit. Specifically, the bulb socket is detachably removed from the light bulb apparatus so that the bulb apparatus is connected to a normal Edison socket. When the bulb socket is used, the light bulb apparatus may be operated in a second operation mode. More details of such design are mentioned below.

In some embodiments, there is an elastic bar for electrically both the two electrodes of the Edison cap. The driver has an impedance detector. When the two electrodes are found electrically connected, the lights source module switches to receive power from an internal battery. For example, the elastic bar contacts both the two electrodes of the Edison cap, making the impedance between the two electrodes of the Edison cap different from daily use. In such case, the driver determines the abnormal situation and cuts off the path of the Edison cap. Instead, the battery path is activated for getting current from the battery.

In some embodiments, the bulb socket has two strings, at least one string has a magnet end for attaching to an external magnet piece. This is particularly helpful when carrying the light bulb apparatus moving around for working.

In some embodiments, at least one string has an end hook for hooking to an external base.

In some embodiments, the bulb socket has a switch for enabling supplying power from an internal battery.

In some embodiments, the second cap body is detachable from the first cap body, the first cap body has a second Edison cap for connecting to an external power source.

In some embodiments, the second cap body has an extending electrode for attaching a function module, the function module receives power from the driver.

In some embodiments, the driver supplies power to the wireless module in the second cap body. In such case, the driver supplies power both to the light source module and the to the wireless module.

In some embodiments, the wireless module has a power driver independently from the driver. In such case, a separate power unit is used for the wireless module so as to separate the influence between the driver and the wireless module. As mentioned above, the wireless module may be replaced other dedicated sensitive electronic devices.

Such design makes the electronic devices more stable.

In some embodiments, the first cap body handles heat dissipation of the light source module and the driver and the second cap body handles heat dissipation of the wireless module. For example, the components in the first cap body and the second cap body are separated trying not to letting heat of one portion to affect the other portion. Two portions have independent heat dissipation structures so as to prevent the heat of the driver or the light source module affecting the operation of the wireless module.

DETAILED DESCRIPTION

Figure 5:
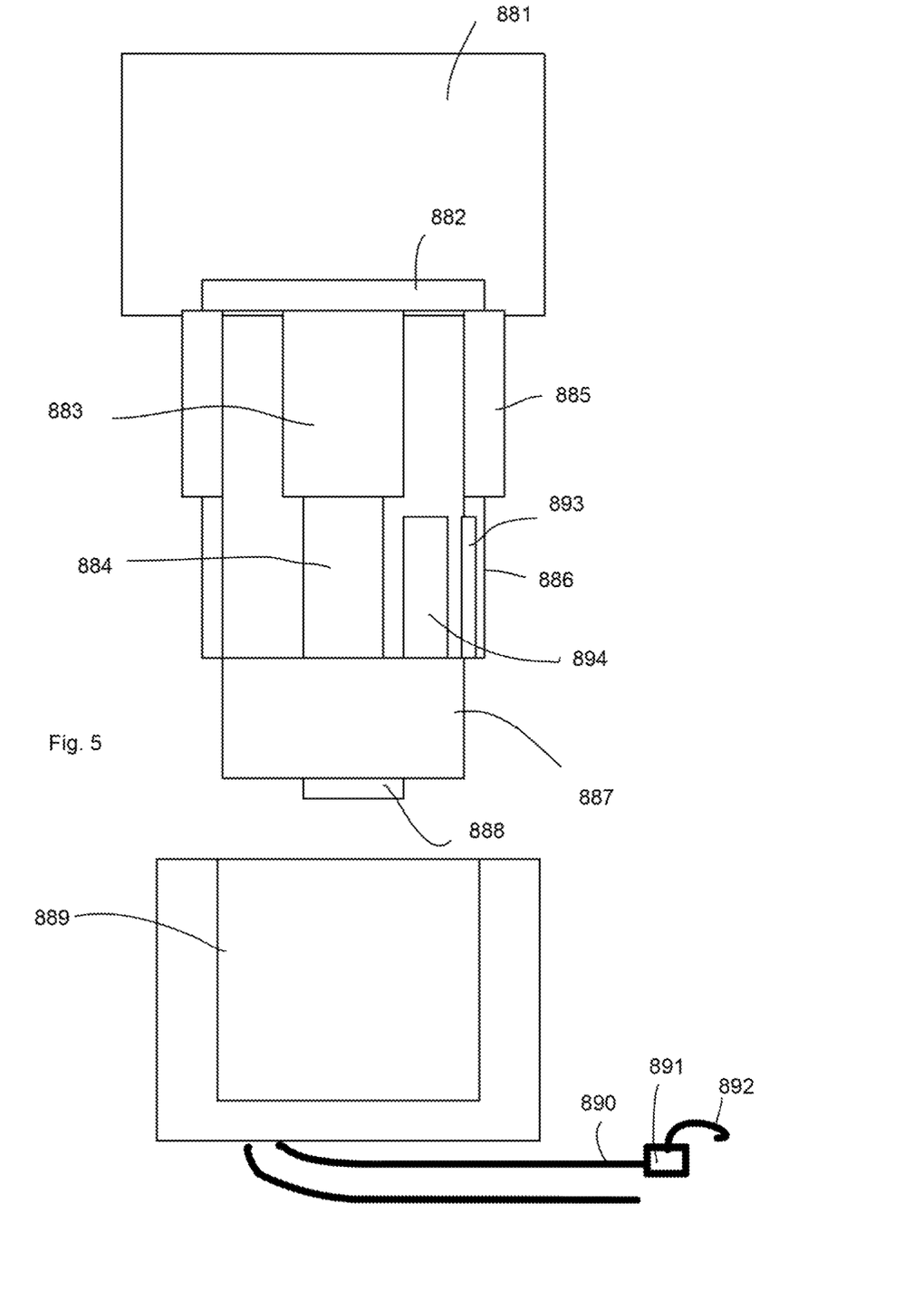
FIG. 5 illustrates a bulb apparatus example.

In FIG. 5, a light bulb apparatus includes a bulb shell 881, a light source module 882, a driver 883, a first cap body 885, a wireless module 884 and a second cap body 886.

The light source module 882 includes a plurality of LED modules. For example, the LED modules are disposed on a light source plate. In some other embodiments, the LED modules may be embedded in elongated filaments, rigid or flexible. In some other embodiments, the LED modules may be accompanied with a light guide or a lens for changing the light paths. In some embodiments, the LED modules may include LED chips of multiple colors or multiple color temperatures for mixing needed parameters.

The first cap body 885 is connected to the bulb shell 881. The first cap body 885 has a surrounding wall. The surrounding wall includes metal material. Heat of the light source module and the driver is transmitted to the surrounding wall.

For example, the first cap body is a tube housing with a surrounding wall. The tube housing is made by molding a plastic insulation layer outside an aluminum body. Such tube housing is helpful on heat dissipation. The light source module may be connected to the tube housing directly or indirectly for transmitting to the tube housing. In addition, the tube housing may enclose partially or completely the driver. Heat of the driver that contains multiple electronic components may be transmitted to the tube housing, too.

The wireless module 884 is electrically connected to the driver 883. The second cap body 886 is connected to the first cap body 885 and an Edison cap. The Edison cap has two electrodes 887, 888 for receiving an external power source from an Edison socket. For example, the lateral screw wall is used for receiving electricity as a first electrode and the bottom piece is used for receiving electricity as a second electrode.

The second cap body is made of plastic material. The wireless module is located at least partially in the second cap body. Unlike being disposed and surrounded by the first cap body, which has metal material, the wireless module is operated in a better environment that no shielding cover affecting signal receiving and transmitting. In addition, to keep the wireless module a distance from the driver helps make the wireless module more stable.

In addition to place a wireless module, other electronic devices that are more sensitive may be added or replace the wireless module mentioned above in other embodiments.

In FIG. 5, the light bulb apparatus may be inserted to a socket base 889. The socket base 889 has two strings 890. A magnet unit 891 is attached at an end of the string 890. A hook 892 may also disposed.

Figure 1:
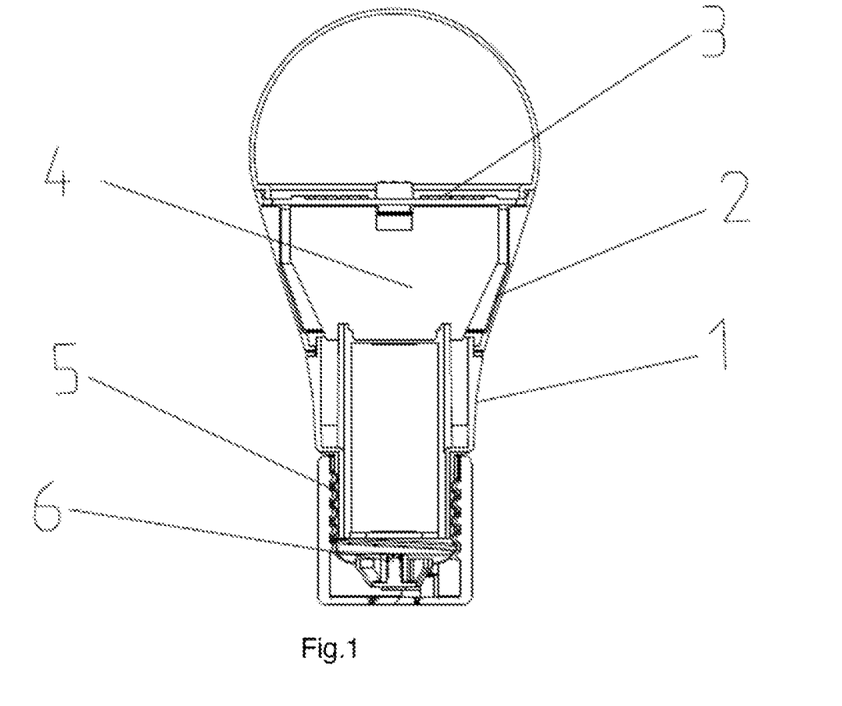
FIG. 1 shows a light bulb apparatus embodiment.

Please refer to FIG. 1. In FIG. 1, a light source 3 is enclosed by a bulb shell. There is a first cap body 2 providing a container space 4 for storing a driver. There is a second cap body 1 surrounding a battery and a wireless module. There is an Edison cap with two electrodes 5, 6 for connecting to a socket base or a common Edison socket that connects to an indoor power source.

Figure 2:
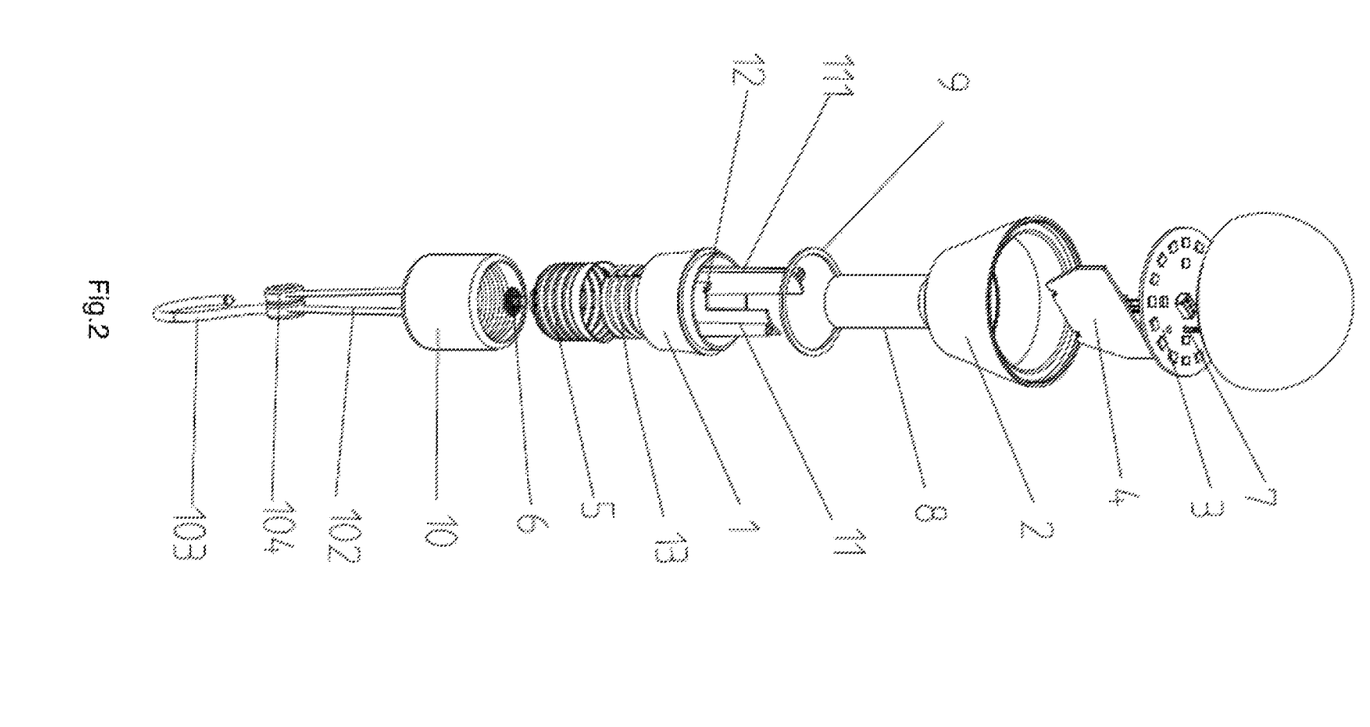
FIG. 2 shows an exploded diagram of a light bulb apparatus.

Please refer to FIG. 2. In FIG. 2, the light bulb embodiment has a light source plate 7 with LED modules 3. There is a driver plate 4 connected to the light source plate 7. The driver plate 4 is enclosed by a surrounding wall of a first cap body 2. There is a battery 8 installed and surrounded partially by a second cap body 1. The second cap body has connecting columns 11, 111 to connect to the light source plate 3. The connecting columns 11, 111 are extended upwardly to connect the light source plate 3, thus clipping the first cap body 2 therebetween. The water proof ring 9 helps enhance water proof.

There is a positioning structure 12 for connecting components. There is a screw structure 13 to be added to an Edison socket that has two electrodes 5, 6. The light bulb apparatus may be inserted to a bulb socket 10.

There are two strings 102 connected to the bulb socket 10 for attaching the light bulb apparatus to another position 102. There is a magnet unit 104 for attaching two strings together. In addition, a hook 103 may also be disposed.

Figure 3:
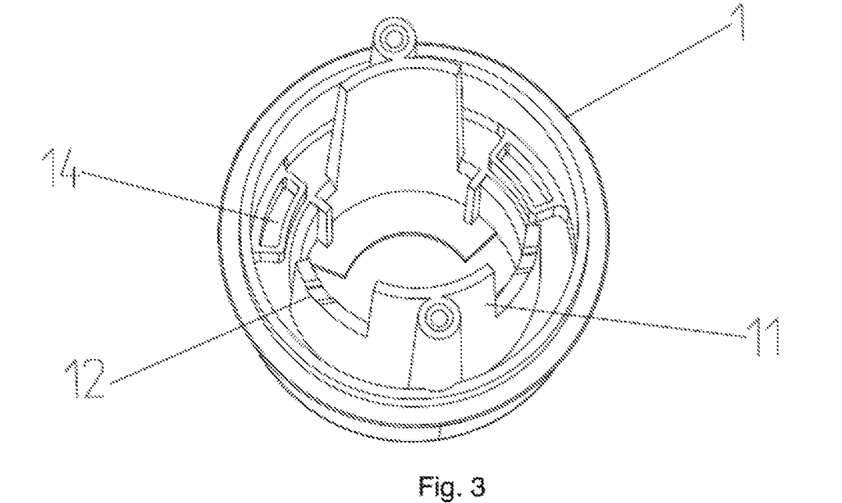
FIG. 3 shows a component.

In FIG. 3, The second cap body 1 has a gas exit 14 for heat dissipation. The connecting column 11 is used for connecting other components and provide structure support. There is a positioning structure 12 for ensuring to align between components.

Figure 4:
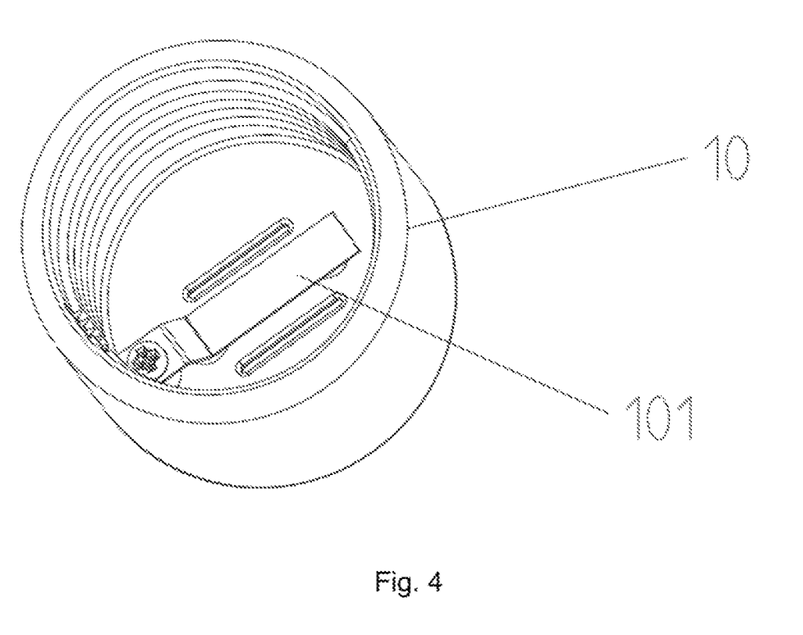
FIG. 4 shows a socket base example.

In FIG. 4, there is an elastic bar 101 for contacting two electrodes of an Edison cap in a base socket 10.

In some embodiments, the first cap body has a plastic surface wrapping an aluminum piece.

In some embodiments, the second cap body has a connecting column extended upwardly to connect to a light source plate of the light source module and is fixed to the first cap body between the lights source module.

In such design, the connecting column is used as a connector for connecting the light source module and the second cap body while clipping the first cap body between the light source module and the second cap body. Such design makes assembling of such light bulb apparatus more easily and thus decrease overall cost.

In FIG. 5, an antenna 894 is placed on the light source plate and electrically connected to the wireless module via the connecting column. Since the light source plate is usually facing to an external space so that light may be escaped to outside, the light source plate is a good place for placing wireless antenna. The wireless module in the second cap body or the driver may connect to the antenna on the light source plate for receiving a better signal quality.

In some wireless design, more than one antenna may be used for enhancing signal quality. Therefore, a first antenna may be disposed with the wireless module and a second antenna may be disposed on the light source plate.

In some embodiments, the light bulb apparatus may also include a battery container for containing a battery at least partially stored in the second cap body.

In some embodiments, the wireless module receives a wakeup command from an external device and controls the battery for supplying power to the light source module.

In some embodiments, the light source module is operated with a lower power than being operated connected to an external power source when the battery supplies power to the light source module.

In some embodiments, the second cap body has an opening for installing the battery to the battery container. For example, the second cap body may have a detachable cover so that the battery may be installed and then put back the detachable cover to the second cap body.

In some embodiments, there is a secondary power socket for detachably connecting to a direct current power source. For example, an USB socket may be disposed on the second cap body or the first cap body for receiving a DC 5V power source for the light bulb apparatus to operate in another mode.

In some embodiments, the second cap body has a bracket for holding an external battery for supplying power to the light source module. As mentioned above, the light bulb may be connected to an external power source. It is common and inexpensive to acquire a USB power module today. Such USB power module may be connected to the light bulb apparatus for providing another working mode conveniently.

In some embodiments, there is a bulb socket with an Edison socket inside for connecting to the Edison cap. For example, the bulb socket is made as a part of the light bulb apparatus kit. Specifically, the bulb socket is detachably removed from the light bulb apparatus so that the bulb apparatus is connected to a normal Edison socket. When the bulb socket is used, the light bulb apparatus may be operated in a second operation mode. More details of such design are mentioned below.

In some embodiments, there is an elastic bar for electrically both the two electrodes of the Edison cap. The driver has an impedance detector. When the two electrodes are found electrically connected, the lights source module switches to receive power from an internal battery. For example, the elastic bar contacts both the two electrodes of the Edison cap, making the impedance between the two electrodes of the Edison cap different from daily use. In such case, the driver determines the abnormal situation and cuts off the path of the Edison cap. Instead, the battery path is activated for getting current from the battery.

In some embodiments, the bulb socket has two strings, at least one string has a magnet end for attaching to an external magnet piece. This is particularly helpful when carrying the light bulb apparatus moving around for working.

In some embodiments, at least one string has an end hook for hooking to an external base.

In some embodiments, the bulb socket has a switch for enabling supplying power from an internal battery.

In some embodiments, the second cap body is detachable from the first cap body, the first cap body has a second Edison cap for connecting to an external power source.

In some embodiments, the second cap body has an extending electrode for attaching a function module, the function module receives power from the driver.

In some embodiments, the driver supplies power to the wireless module in the second cap body. In such case, the driver supplies power both to the light source module and the to the wireless module.

In some embodiments, the wireless module has a power driver independently from the driver. In such case, a separate power unit is used for the wireless module so as to separate the influence between the driver and the wireless module. As mentioned above, the wireless module may be replaced other dedicated sensitive electronic devices.

Such design makes the electronic devices more stable.

In some embodiments, the first cap body handles heat dissipation of the light source module and the driver and the second cap body handles heat dissipation of the wireless module. For example, the components in the first cap body and the second cap body are separated trying not to letting heat of one portion to affect the other portion. Two portions have independent heat dissipation structures so as to prevent the heat of the driver or the light source module affecting the operation of the wireless module.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A light bulb apparatus, comprising:
a bulb shell;
a light source module comprising a plurality of LED modules;
a driver;
a first cap body connected to the bulb shell, wherein the first cap body has a surrounding wall, wherein the surrounding wall comprises metal material, wherein heat of the light source module and the driver is transmitted to the surrounding wall, wherein the surrounding wall surrounds the driver;
a wireless module electrically connected to the driver; and
a second cap body connected between the first cap body and an Edison cap, wherein the Edison cap has two electrodes for receiving an external power source from an Edison socket, wherein the second cap body is made of plastic material, wherein the wireless module is located with a distance from the driver and is located at least partially in the second cap body.

2. The light bulb apparatus of claim 1, wherein the first cap body has a plastic surface wrapping an aluminum piece.

3. The light bulb apparatus of claim 1, wherein the second cap body has a connecting column extended upwardly to connect to a light source plate of the light source module and fix the first cap body between the lights source module.

4. The light bulb apparatus of claim 3, wherein an antenna is placed on the light source plate and electrically connected to the wireless module via the connecting column.

5. The light bulb apparatus of claim 1, further comprising a battery container for containing a battery at least partially stored in the second cap body.

6. The light bulb apparatus of claim 5, wherein the wireless module receives a wakeup command from an external device and controls the battery for supplying power to the light source module.

7. The light bulb apparatus of claim 5, wherein the light source module is operated with a lower power than being operated connected to an external power source when the battery supplies power to the light source module.

8. The light bulb apparatus of claim 5, wherein the second cap body has an opening for installing the battery to the battery container.

9. The light bulb apparatus of claim 1, wherein there is a secondary power socket for detachably connecting to a direct power source.

10. The light bulb apparatus of claim 9, wherein the second cap body has a bracket for holding an external battery for supplying power to the light source module.

11. The light bulb apparatus of claim 1, wherein there is a bulb socket with an Edison socket inside for connecting to the Edison cap.

12. The light bulb apparatus of claim 11, wherein there is an elastic bar for electrically connecting to both the two electrodes of the Edison cap, wherein the driver has an impedance detector, wherein when the two electrodes are found electrically connected, the lights source module switches to receive power from an internal battery.

13. The light bulb apparatus of claim 11, wherein the bulb socket has two strings, at least one string has a magnet end for attaching to an external magnet piece.

14. The light bulb apparatus of claim 13, wherein at least one string has an end hook for hooking to an external base.

15. The light bulb apparatus of claim 11, wherein the bulb socket has a switch for enabling supplying power from an internal battery.

16. The light bulb apparatus of claim 1, wherein the second cap body is detachable from the first cap body, the first cap body has a second Edison cap for connecting to an external power source.

17. The light bulb apparatus of claim 1, wherein the second cap body has an extending electrode for attaching a function module, the function module receives power from the driver.

18. The light bulb apparatus of claim 1, wherein the driver supplies power to the wireless module in the second cap body.

19. The light bulb apparatus of claim 1, wherein the wireless module has a power driver independently from the driver.

20. The light bulb apparatus of claim 1, wherein the first cap body handles heat dissipation of the light source module and the driver and the second cap body handles heat dissipation of the wireless module.

\* \* \* \* \*